United States Patent [19]

Masataka et al.

[11] Patent Number: 5,157,091

[45] Date of Patent: Oct. 20, 1992

[54] ULTRAVIOLET-ABSORBING POLYMER MATERIAL AND PHOTOETCHING PROCESS

[76] Inventors: Murahara Masataka, 935, Nikaido, Kamakura-shi, Kanagawa 248; Shimomura Takeshi, 2656-1, Ohbuchi, Fuji-shi, Shizuoka 417; Takahashi Toru, c/o Terumo Kabushiki Kaisha, 2656-1, Ohbuchi, Fuji-shi, Shizuoka 417, all of Japan

[21] Appl. No.: 469,476

[22] PCT Filed: Oct. 7, 1988

[86] PCT No.: PCT/JP88/01028

§ 371 Date: May 23, 1990

§ 102(e) Date: May 23, 1990

[87] PCT Pub. No.: WO89/03402

PCT Pub. Date: Apr. 20, 1989

[30] Foreign Application Priority Data

Oct. 7, 1987 [JP] Japan ............... 62-251635
Oct. 16, 1987 [JP] Japan ............... 62-261045
Oct. 16, 1987 [JP] Japan ............... 62-261046

[51] Int. Cl.⁵ ............................... C08F 18/20
[52] U.S. Cl. ................................... 526/245
[58] Field of Search ........................... 526/245

[56] References Cited

U.S. PATENT DOCUMENTS

| | | |
|---|---|---|
| 4,259,407 | 3/1981 | Tada et al. |
| 4,347,162 | 8/1982 | Invernizzi et al. ........... 526/124 |
| 4,382,985 | 5/1983 | Hattori et al. |
| 4,421,842 | 12/1983 | Hattori et al. |
| 4,421,843 | 12/1983 | Hattori et al. |
| 4,705,612 | 11/1987 | Shimomura et al. ........... 204/165 |
| 4,737,556 | 4/1988 | Itoh et al. ........... 526/245 |

FOREIGN PATENT DOCUMENTS

| | | | |
|---|---|---|---|
| 0128516 | 12/1984 | European Pat. Off. ........... 526/245 |
| 0294976 | 12/1988 | European Pat. Off. ........... 526/245 |
| 54-145127 | 11/1979 | Japan . |
| 55-18638 | 2/1980 | Japan . |
| 55-138834 | 10/1980 | Japan . |
| 0051705 | 3/1982 | Japan ........... 526/245 |
| 57-89753 | 6/1982 | Japan . |
| 58-5734 | 1/1983 | Japan . |
| 58-5735 | 1/1983 | Japan . |
| 58-33246 | 2/1983 | Japan . |
| 58-100684 | 6/1983 | Japan . |
| 59-90930 | 5/1984 | Japan . |
| 59-127037 | 7/1984 | Japan . |
| 61-29129 | 2/1986 | Japan . |
| 61-53732 | 3/1986 | Japan . |
| 61-152773 | 7/1986 | Japan ........... 526/245 |
| 61-226746 | 10/1986 | Japan . |
| 62-9347 | 1/1987 | Japan . |
| 62-59950 | 3/1987 | Japan . |
| 2-041378 | 2/1990 | Japan ........... 526/245 |
| 2-202904 | 8/1990 | Japan ........... 526/245 |

*Primary Examiner*—Joseph L. Schofer
*Assistant Examiner*—N. Sarofim
*Attorney, Agent, or Firm*—Burns, Doane, Swecker & Mathis

[57] ABSTRACT

An ultraviolet-absorbing polymer material comprising a copolymer of a (meth)acrylic ester monomer with a monomer possessing at least one substituting fluorine atom. A photoetching process, characterized by forming a resist film of the ultraviolet-absorbing polymer material on a substrate, exposing this resist film through a light mask to a light beam of a first wavelength, optionally subjecting the resist film in an atmosphere of a photodessociating gas to a light beam of a second wavelength, and effecting an etching treatment by virtue of a reactive radical formed by dissociation.

4 Claims, 8 Drawing Sheets

FIG. 1(a)
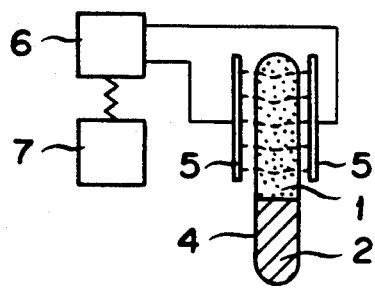
FIG. 1(b)
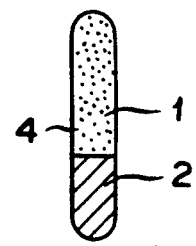
FIG. 2(a)
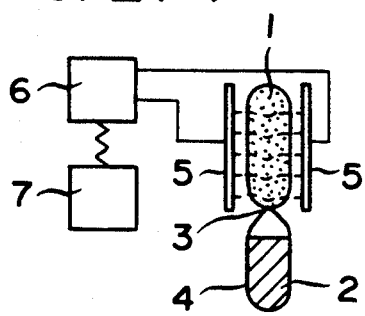
FIG. 2(b)
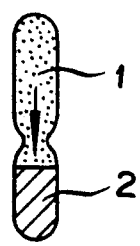
FIG. 3(a)
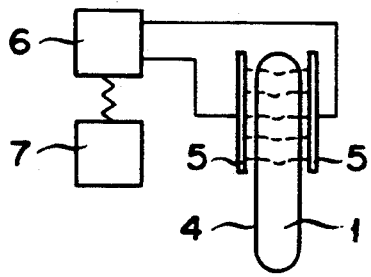
FIG. 3(c)
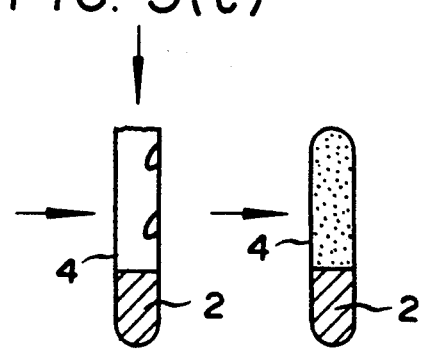
FIG. 3(b)  FIG. 3(d)

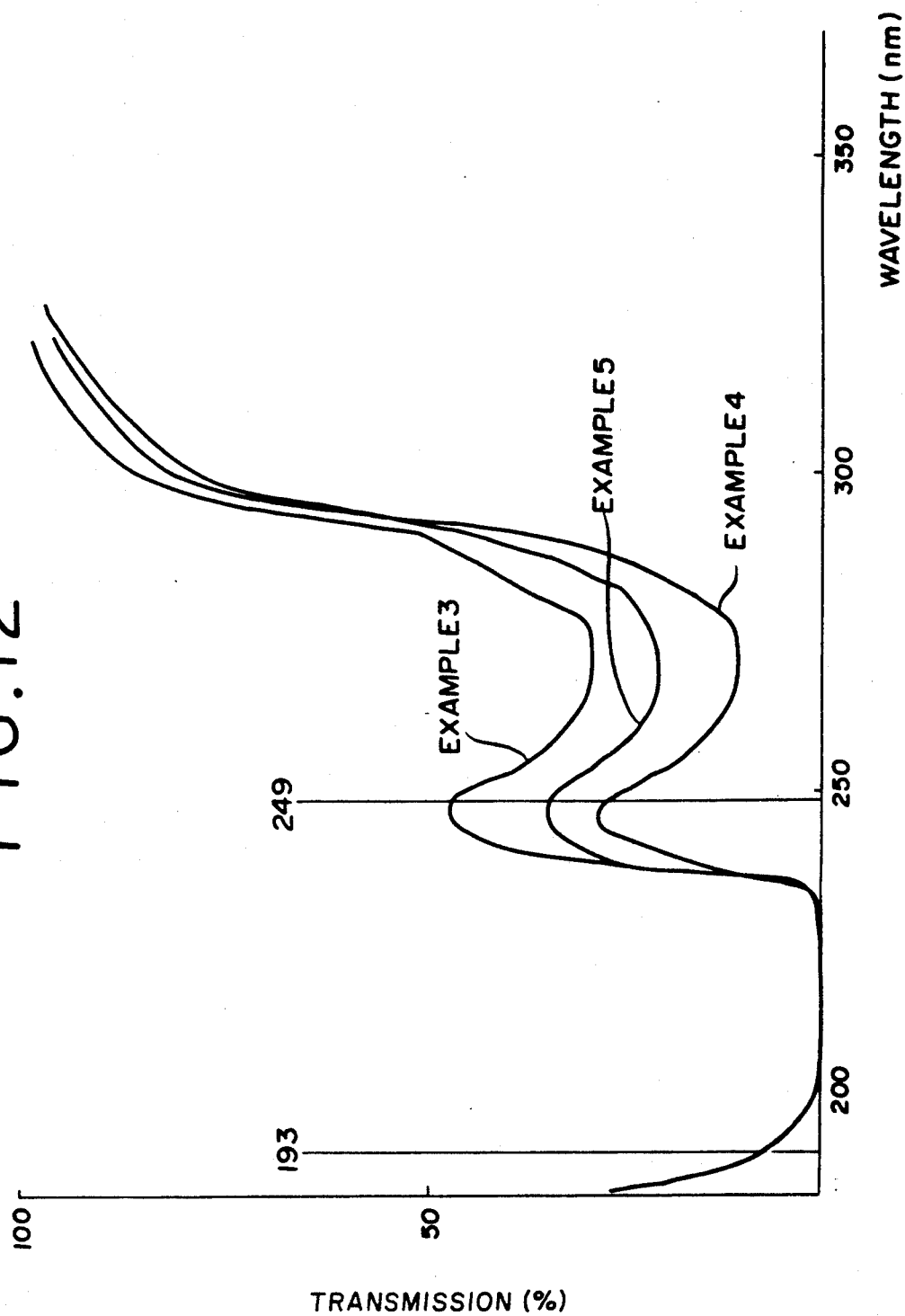

ULTRAVIOLET-ABSORBING POLYMER MATERIAL AND PHOTOETCHING PROCESS

DESCRIPTION

1. Technical Field

This invention relates to an ultraviolet-absorbing polymer material. More particularly, this invention relates to an ultraviolet-absorbing polymer material which fits excimer laser working and, when used as a resist material and exposed to the excimer laser, allows formation of a pattern of high resolution with an easy etching operation. This invention further relates to an ultraviolet-absorbing polymer material which possesses high sensitivity to shortwave radiations of not more than 400 nm in wavelength (ultraviolet light, electron beam, and X ray), particularly to the Kr-F laser beam (249 nm) in addition to exhibiting the property mentioned above.

The present invention also relates to a photoetching process. More particularly, the present invention relates to a process for photoetching which is capable of producing patterns of high resolution within 1 μm in line width.

2. Background Art

Generally, in the construction of semiconductor devices such as IC's, LSI's and super-LSI's, the introduction of a desired impurity distribution, namely the control of an impurity distribution, constitutes a very important task. Today the manufacture of such semiconductor devices as mentioned above has advanced to the point at which the accuracy of position of a pn junction parallel to the crystal face relative to the direction of depth is notably improved by the introduction of the technique of impurity dispersion and the accurate distribution of impurity in the direction of crystal face is rendered feasible by the adoption of the technique of selective diffusion capable of covering the portion abhorring diffusion of impurity with a substance impermeable to the impurity during the course of impurity dispersion.

For the formation of the pattern with a substance impermeable to the impurity on the surface of a semiconductor, there has been generally used in most cases an applied photographic technique which comprises coating the surface of a substrate with a resist material, superposing a masking sheet on the layer of the resist material, exposing the masked surface of the layer of the resist material to the light emanating from a light source disposed above, then removing the masking sheet, stripping the layer of the resist material of the sensitized part or non-sensitized part (optionally by the developing treatment), and etching the part of the substrate not covered with the resist material with a solvent. Further, in the manufacture of a semiconductor device, this technique is similarly utilized to advantage as in the formation of an electrode hole, the removal of unfused vacuum-deposited metal after the vacuum deposition of an electrode, and the formation of a gate, for example.

Incidentally, polyalkyl (meth)acrylates represented by polymethyl methacrylate (PMMA) form resist materials possessing high degrees of resolution and have been heretofore finding extensive utility in various applications as resist materials useful with electron beam, far-ultraviolet light, and X ray. In the aforementioned manufacture of a semiconductor device, therefore, the use of these resist materials is expected to allow formation of patterns of high degrees of resolution.

When the resist material of a polyalkyl (meth)acrylate is used in the manufacture of a semiconductor device, however, the resist material is fasted to pose a serious problem from the standpoint of the etching treatment.

As semiconductor devices of the kind described above, silicon devices are preponderantly used today. As the substance impermeable to impurity which is used for covering the surface of a silicon wafer, a $SiO_2$ film is generally used. A mixed liquid of $NH_4F$ and $HF$ has been used for etching the $SiO_2$ film on the silicon wafer and a mixed liquid of hydrofluoric acid (HF) and nirtric acid for etching silicon. Polyalkyl (meth)acrylates are not sufficiently resistant to these etching liquids. When the resist material made of a polyalkyl (meth)acrylate is used, therefore, there arises the possibility that the surface of the resist material will be corroded by the etching liquid and the formation of a highly desirable pattern on the substrate will be obstructed.

In the circumstances, a desire is expressed to improve the ability of a polyalkyl (meth)acrylate type resist material to resist the impact of etching.

As the radiation source for the resist material, a mercury vapor lamp such as a high-pressure mercury vapor lamp of 356 nm or a xenon lamp has been heretofore used. This radiation source is used for protracted exposure covering a duration on the order of 5 to 10 minutes. When the lamp is used for the protracted exposure, it is susceptible of such adverse effects as deviation of focal point and vibration in the base of a measuring instrument, for example. Thus, it has been difficult to obtain a clear image by the exposure using the radiation source under discussion.

The manufacture of semiconductor devices, therefore, tends now toward using a more powerful light source as the radiation source. As one such powerful light source, the adoption of an excimer laser has been advocated. The term "excimer" as used herein refers to the diamer of an exciting atom or molecule and a basis atom or molecule. This laser is capable of emitting ultraviolet light in short pulses at a high output. It has been known, therefore, to be capable of effecting the one-photon or two-photon absorption reaction in an extraordinarily short time as compared with the photochemical reaction effected by the use of the conventional mercury vapor lamp or xenon lamp [Shuntaro Watabe et al, "Applied Physics," 46, 978 (1977)].

When the bonding energy and the absorption wavelength between molecules desired to be disconnected are known, therefor, a laser suitable for the severance may be selected and used for sensitizing a resin under treatment. When the C—H bond of a polymethyl methacrylate resist mentioned above is to be severed by the one-photon absorption, for The KrF laser or an excimer laser of a wavelenglth shorter than the KrF laser can be utilized.

The absorption region of this resin is between 195 and 230 nm on the relatively short wavelength side and exhibits high absorption to the ArF laser but low absorption to the KrF laser. The KrF laser is not sufficiently effective in etching the resin. The feasibility of the idea of incorporating about 10% of a heterocyclic aromatic compound (such as, for example, anthracene, acridine, phenazine, carbazole, biphenyl, or benzoin) in polymethyl methacrylate is now under study. It has been reported that the resin incoporating the aromatic compound exhibits strong absorption to the KrF laser and possesses high resolution [Masataka Murahara, Yoshiyuki Kawamura, Koichi Toyota, and Susumu Namba, "Applied Physics," 52, 88 (1983)]. The measure resorting exclusively to the incorporation of the heterocyclic aromatic compound as a photosensitizing agent in the polymethyl methacrylate is futile because the polymer solution of the polymethyl methacrylate is stripped of the incorporated photosensitizing agent by evaporation and prevented from manifesting stable absorption characteristic when this polymer solution is applied to a given substrate and then baked at a temperature exceeding about 150° C.

When the excimer laser is used for the purpose of allowing a reduction in the wavelength of a light as the radiation source and an increase in the numerical aperture (NA) of a lens thereby permitting an addition to the degree of resolution, there arises the problem of decreasing the depth of focal point as described herein below.

To be specific, the resolving power R of photolithography is generally determined by the following formula:

$$R = K \frac{\lambda}{NA}$$

wherein $\lambda$ is the wavelength of a given light source (a contracting projection exposure device: "stepper"), NA for the numerical aperture, and k for a constant to be decided by the coherence factor of the illumination system, the kind of the resist material, and the type of resist process.

This formula implies that an increase in the resolving power R may be attained by (1) shortening the wavelength of the light source (namely decreasing the magnitude of $\lambda$), (2) increasing the numerical aperture (NA), and (3) improving the resist material and the process (namely decreasing the value of k).

It is only plain, therefore, that the high degree of resolution, if theoretically, ought to be attained by using an excimer laser stepper as the stepper mentioned above thereby shortening the wavelength and increasing the numerical aperture. Since the depth of focal point (DOF) when the stepper is used is expressed as, $DOF = \lambda/(NA)^2$, the value of DOF decreases in proportion as the decrease in wavelength and the increase in NA are promoted. Particularly, the increase in NA brings about a serious problem that the effect thereof increases by an exponent of 2.

When the depth of focal point is small, the development possibly entails partial distortion (failure to form a focus) and a proportionate decrease of process margin.

To ensure the enhancement of the resolving power by shortening the wavelength of the light source and increasing the value of NA of the optical lens, it must be rendered feasible to use the resist material in the form of thin film of a thickness of about 1 $\mu$m, preferably a thickness of not more than 0.5 $\mu$m.

The resist material heretofore adopted for practical use, however, is such that the resist material prepared in the form of a thin film sustains pinholes and suffers from loss of resistance to etching.

The present inventors formerly developed an ultraviolet-absrobing polymer material obtained by copolymerizing a methacrylic ester monomer as a hopeful raw material for a resist material usable with an excimer laser as the radiation source with other vinyl monomer possessing a chromophore exhibiting an absorption peak within the range of ultraviolet wavelength (PCT/JP 87/00954). In this case, the sensitized ultraviolet-absorbing property is extremely stable because the sensitization is effected by the other monomer incorporated in the copolymer. When the copolymer incorporate therein as the other vinyl monomer such a compound as vinyl bipheny, vinyl pyridine, vinyl naphthalene, or N-vinyl carbazole which possesses a chromophore exhibiting an absorption peak in the neighborhood of 249 nm, for example, the light absorptance of the copolymer relative to the wavelength near 249 nm can be shifted to a very high level. The copolymer to be used as a photoresist fated to be exposed to the KrF laser as the light source is allowed to acquire a high degree of resolution. Further, enhancement of the resolution has been rendered feasible by producing the polymer material with an extremely high molecular weight thereby allowing the resist material to be molded in the form of a thin film and, at the same time, increasing the density of the C—H bond in the main chain owing to the addition of the molecular weight thereby enabling the severance of the C—H bond in the exposed region by virtue of the absorption energy to proceed with improved efficiency.

Further, in the copolymer, the extremely high molecular weight which the copolymer is allowed to acquire serves the purpose of preventing to some extent the otherwise possible degradation of the resistance to etching due to the molding of the resist material in the form of this film. When this copolymer is used in the manufacture of such a semiconductor device as described above, however, the ability of the copolymer to resist etching is not sufficient and has room for further improvement.

The etching treatment for inscribing a prescribed pattern in a substrate has been heretofore effected by immersing in the aforementioned etching liquid the substrate having a resist pattern formed thereon or by spraying the etching liquid on the substrate. In the operation of wet etching mentioned above, however, it has been difficult to control the etching accurately in terms of size and shape because the resist material is susceptible of corrosion as described above, because the portion of the substrate covered with the resist material submits itself to permeation of the etching liquid, and because the reaction of solution caused in the substrate by the etching liquid proceeds isotropically. In more recent years, to take the place of these methods of wet etching, such dryetching methods as the plasma etching method which effects required etching by producing a plasma in a vapor phase by high-frequency excitation, allowing a chemically active radical present in the plasma to react on the substrate and give rise to a compound of high vapor pressure, and gassifying the compound and the spatter etching method and the ion beam etching method which effect required etching by hurling ions or atoms of an inert gas on the substrate thereby expelling atoms from the substrate physically or mechanically are now under development. By the plasma etching method, however, sharp etching is not easily obtained because the radicals present in the plasma produced by the high-frequency excitation lack directionality and the etching is suffered to proceed isotropically. The spatter etching method and the ion beam etching method allow sharp etching because the etching proceeds anisotropically and yet fail to obtain selective etching and suffer from erosion of the resist material because the etching takes place physically or mechanically. Thus, these dry etching methods have room for further study.

The desirability of developing an etching method capable of forming a pattern quickly with a high degree of resolution by a simple procedure has been finding recognition from a different point of view.

An object of this invention, therefore, is to provide a novel ultraviolet-absorbing polymer material. Another object of this invention is to provide a polyalkyl(meth-)acrylate type ultraviolet-absorbing polymer material excelling in resistance to etching. A further object of this invention is to provide a ultraviolet-absorbing polymer material which is fit for excimer laser processing and which, when used as a resist material and exposed to the excimer laser, is allowed to form a pattern with high resolution by an easy etching procedure.

The present invention further relates to a shortwave light-absorbing polymer which exhibits satisfactory resistance to etching and, at the same time, possesses high sensitivity to a light of short wavelength not exceeding 400 nm (ultraviolet light, electron beam, or X ray), particularly to the Kr-F laser beam (249 nm).

The present invention further aims to provide a novel photoetching method. This invention also aims to provide a photoetching method capable of producing a pattern with high resolution enough to have a line width of not more than 1 μm.

DISCLOSURE OF THE INVENTION

The objects described above are accomplished by a ultraviolet-absorbing polymer material, comprising a copolymer of a (meth)acrylic ester monomer with a monomer possessing at least one substituting fluorine atom.

The present invention further discloses an ultraviolet-absorbing polymer material having the main chain thereof composed substantially of the following repeating units:

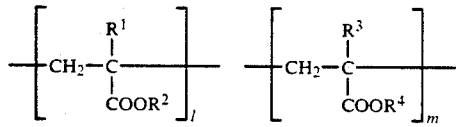

wherein $R^1$ and $R^3$ are independently hydrogen atom or methyl group, $R^2$ is an alkyl group of 1 to 5 carbon atoms, $R^4$ is an alkyl fluoride group of 1 to 8 carbon atoms having at least one hydrogen atom substituted with fluorine atom, and $l/m$ is in the range of 0.3 to 5. The present invention further discloses an ultraviolet-absorbing polymer material having an average molecular weight in the range of $5 \times 10^5$ to $5 \times 10^7$, preferably $5 \times 10^6$ to $5 \times 10^7$. The present invention further discloses a ultraviolet-absorbing polymer material having an alkyl fluoride group of 1 to 4 carbon atoms as the substituent $R^4$ in the repeating units mentioned above. The present invention further discloses a ultraviolet-absorbing polymer material having as the monomer possessing at least one substituting fluorine atom at least one member selected from the group consisting of trifluoroethyl methacrylate, hexafluoroisopropyl methacrylate, trifluoroethyl acrylate, and hexafluoroisopropyl acrylate. The present invention further discloses an ultraviolet-absorbing polymer material having as the monomer possessing at least one substituting fluorine atom at least one member selected from the group consisting of hexafluorobutene, hexafluorobutadiene, and hexafluoropropene.

The present invention further discloses an ultraviolet-absorbing polymer material comprising a copolymer of a (meth)acrylic ester monomer with a monomer possessing at least one substituting fluorine atom and a vinyl monomer possessing an aromatic ring or a heterocyclic aromatic ring in the molecular backbone thereof. The present invention further discloses an ultraviolet-absorbing polymer material having the main chain thereof composed substantially of the following repeating units:

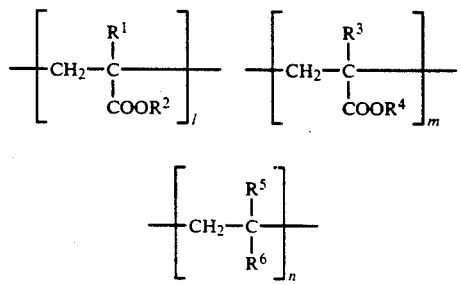

wherein $R^1$, $R^3$, and $R^5$ are independently hydrogen atom or methyl group, $R^2$ is an alkyl group of 1 to 5 carbon atoms, $R^4$ is an alkyl fluoride group of 1 to 8 carbon atoms having at least one hydrogen atom substituted with a fluorine atom, $R^6$ is a group possessing an aromatic ring or a heterocyclic aromatic ring, and $l/m$ is in the range of 0.3 to 5 and $(l+m)/n$ is in the range of 30 to 200.

The objects described above are also accomplished by a photoetching method characterized by forming a resist film on a substrate, exposing the resist film through a light mask to a beam of light of a first wavelength, then subjecting the resist to a developing treatment, subsequently exposing the developed resin in an atmosphere of a photodissociating gas to a beam of light of a second wavelength, and effecting an etching treatment with the reactive radical formed in consequence of the dissociation.

The present invention further compound discloses a photoetching method using an interhalogen compound gas as the photodissociating gas. The present invention further discloses a photoetching method using $ClF_3$ as the photodissociating gas. The present invention further discloses a photoetching method using the KrF laser or the ArF laser as the beam of light of the first wavelength and the XeF laser as the beam of light of the second wavelength.

The objects described above are also accomplished by a photoetching method characterized by forming a resist film on a substrate, exposing the resist film through a light mask to the beam of light of a first wavelength, then exposing the resist film in an atmosphere of a photodissociating gas to the beam of light of a second wavelength, and effecting an undedeveloped etching treatment with a reactive radical formed in consequence of the dissociation.

The present invention further discloses a photoetching method using an interhalogen compound gas as the photodissociating gas. The present invention further discloses a photoetching method using the KrF laser or the ArF laser as the beam of light of the first wavelength and the XeF laser as the beam of light of the second wavelength.

BRIEF DESCRIPTION OF DRAWINGS

FIGS. 1a and b, FIGS. 2a and b, and FIGS. 3a to d are each diagrams illustrating a typical procedure of plasma-initiated polymerization to be used in the preparation of an ultraviolet-absorbing polymer material according with the present invention, FIG. 12 is a diagram of ultraviolet absorption spectrum charts of copolymers obtained in Examples 3 to 5 of the present invention.

BEST MODE FOR CARRYING OUT THE INVENTION

Figure 4A:
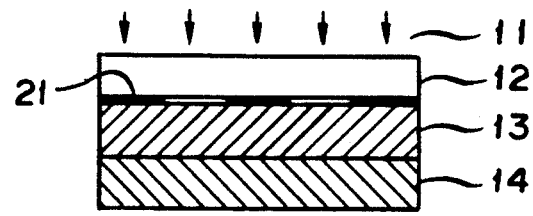
FIGS. 4a to c are type diagrams illustrating a treating step in the photoetching method according with the present invention.

Now, the present invention will be described in detail below with reference to working examples. For the purpose of facilitating the comprehension of the present invention, the four sections titled "Ultraviolet-absorbing polymer material I," "Ultraviolet-absorbing polymer material II," "Photoetching method," and "Examples" will be inserted herein below.

Ultraviolet-absorbing polymer material I

The present inventors have continued a diligent study in search of improvements in and concerning the ability of a resist material of a polyalkyl(meth)acrylate type resin, to find that by copolymerizing a (meth)acrylic ester monomer with a monomer possessing at least one substituting fluorine atom, there is obtained a polymer compound which manifests resistance to etching, particularly high resistance to an etching liquid containing hydrogen fluoride, without any sacrifice of the excelling resolving power owned inherently by polyalkyl(meth)acrylate type resins in general. The present invention has been perfected as the result. To be specific, this invention is directed to a ultraviolet-absorbing polymer material comprising a copolymer of a (meth)acrylic ester monomer with a monomer possessing at least one substituting fluorine atom.

As examples of the (meth)acrylic ester monomer usable in the present invention as one of the comonomers to form the copolymer mentioned above, there may be cited such (meth)acrylic esters as methyl methacrylate, ethyl methacrylate, n-propyl methacrylate, isopropyl methacrylate, n-butyl methacrylate, methyl acrylate, ethyl acrylate, n-propyl acrylate, isopropyl acrylate, and n-butyl acrylate which possess an ester group comprising an alkyl group of 1 to 5 carbon atoms. Among other (meth)acrylic esters mentioned above, (meth)acrylic esters possessing an alkyl group of 1 to 4 carbon atoms prove to be particularly preferable and methyl methacrylate to be most preferable. The (meth)acrylic ester monomer as one of the comonomers forming the copolymer need not be limited to a simple monomer but may be in the form of a combination of two or more monomers.

The monomer, i.e. the other comonomer of the copolymer, possessing at least one substituting fluorine atom has no particular restriction except for the requirement that it should be copolymerizable with the (meth)acrylic ester monomer mentioned above. As examples of the monomer of this description, there may be mentioned (meth)acrylic ester fluorides such as monofluoromethyl methacrylate, difluoroethyl methacrylate, trifluoroethyl methacrylate, trifluoroisopropyl methacrylate, hexafluoroisopropyl methacrylate, monofluoromethyl acrylate, difluoroethyl acrylate, trifluoroethyl acrylate, trifluoroisopropyl acrylate, and hexafluoroisopropyl acrylate and hexafluorobutene, hexafluorobutadiene-1,3, and hexafluoropropene as well. Among other monomers cited above, (meth)acrylic ester fluorides possessing an alkyl group of 1 to 8 carbon atoms, preferably 1 to 4 carbon atoms, specifically represented by trifluoroethyl methacrylate, trifluoroethyl acrylate, and hexafluoroisopropyl acrylate, prove to be particularly desirable. The other comonomer of the copolymer, namely the monomer possessing at least one substituting fluorine atom, need not be limited to a simple monomer but may be in the form of a combination of two or more monomers.

The typical copolymer as the ultraviolet-absorbing polymer material of this invention has the main chain thereof composed substantially of the following repeating units;

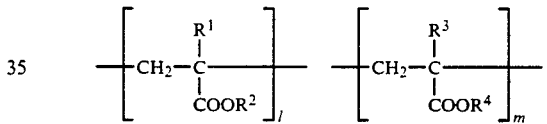

wherein $R^1$ and $R^3$ are independently hydrogen atom or methyl group, $R^2$ is an alkyl group of 1 to 5 carbon atoms, $R^4$ is an alkyl fluoride group of 1 to 8 carbon atoms having at least one hydrogen atom substituted with fluorine atom, and $l/m$ is in the range of 0.3 to 5.

The reason for the range, 0.3 to 5, fixed for the ratio $l/m$ (molar ratio) is that the possibility of the polymerization reaction failing to proceed is large if the ratio $l/m$ is less than 0.3 and the possibility of the produced copolymer failing to exhibit sufficiently the ability to resist etching is large if the ratio $l/m$ exceeds 5.

The copolymer to form the ultraviolet-absorbing polymer material of this invention is desired to possess an average molecular weight in the range of $5 \times 10^5$ to $5 \times 10^7$, preferably $5 \times 10^6$ to $5 \times 10^7$. The reason for the lower limit, $5 \times 10^5$, is that the possibility of the copolymer failing to acquire such properties as mechanical strength, resistance to heat, and difference of solubility before and after exposure which the ultraviolet-absorbing polymer material is required to possess is large is large if the average molecular weight is less than $5 \times 10^5$. When the copolymer possesses an extremely high average molecular weight in the range of $5 \times 10^6$ to $5 \times 10^7$, it acquires a high film strength enough to permit formation of a thin film not more than 1 μm, preferably not more than 0.5 μm, in thickness and allow a reduction in wavelength of the light and an increase in NA. The copolymer of such a high average molecular weight also possesses the C—H bond in the main chain thereof in a high density such that the copolymer used as a photoresist material exhibits still better resolution because the severance of the C—H bond in the part exposed to the ultraviolet light by the absorption energy proceeds with enhanced efficiency. If further acquires high sensitivity enough for the difference of resolution before and after the exposure to be amply widened. It also acquires sufficient resistance to heat and, therefore, can be safely exposed to a high baking temperature. Thus, the high average molecular weight is desirable in the sense that the copolymer acquires such highly satisfactory properties as described above.

As means of producing a desired copolymer by the copolymerization of a (meth)acrylic ester monomer with a monomer possessing at least one substituting fluorine atom, various polymerization methods are conceivable. By the well-known methods for polymerization of a vinyl monomer, however, it is difficult to attain the formation of a copolymer possessing an extremely high average molecular weight of $5 \times 10^6$ to $5 \times 10^7$. Even by the ordinary methods of plasma-initiated polymerization which are widely known as available for the polymerization of super-polymer compounds, it is difficult to effect the polymerization for the production of the copolymer of the composition described above. The ultraviolet-absorbing polymer material of the present invention possessing the extremely high molecular weight can be prepared easily in a high yield by the method of plasma-initiated polymerization involving additional use of a radical polymerization initiator and comprising the steps of causing the presence of the radical polymerization initiator in a gaseous phase containing the monomers in the form of vapor, irradiating the gaseous phase to a plasma, guiding polymerization-initiating active seeds generated in consequence of the plasma irradiation to the monomers now in a condensed phase thereby inducing chain growth polymerization of the monomers (Japanese Patent Application SHO 60(1985)-22,001). This method of polymerization does not always require all of the monomers destined to form the copolymer to be present in the gaseous phase. The presence of only one monomer in the gaseous phase may suffice so long as all of the monomers for the copolymer are present in the polymerization system after the plasma irradiation. The presence of an alcohol in the condensed phase in which postpolymerization is carried out serves the purpose of shortening the polymerization time and improving the yield (Japanese Patent Application SHO 60(1985)-224,892).

As the radical polymerization initiator to be used in the present method of plasma-initiated polymerization, any of the ordinary initiators fit for radical polymerization of a monomer may be used. The radical polymerization initiators usable herein are low-temperature active radical polymerization initiators including peroxides such as acetylcyclohexylsulfonyl peroxide, isobutyryl peroxide, cumylperoxyneodecanoate, diisopropylperoxy dicarbonate, di-n-propylperoxy dicarbonate, dicyclohexylperoxy dicarbonate, dimyristylperoxy dicarbonate, di-(2-ethoxyethyl)peroxy dicarbonate, di-(methoxyisopropylperoxy) dicarbonate, di-(2-ethylhexylperoxy) dicarbonate, di(3-methyl-3-methoxybutyl)-peroxy dicarbonate, t-butylperoxy neodecanoate, potassium persulfate, and ammonium persulfate and azo compounds such as 2,2'-azobis(4-methoxy-2,4-dimethyl valeronitrile) and 2,2'-azobis(2,4-dimethylvaleronitrile) and high-temperature active radical polymerization initiators including peroxides such as t-butylcumyl peroxide, diisopropylbenzene hydroperoxide, di-t-butyl peroxide, p-menthane hydroperoxide, 2,5-dimethyl-2,5-di-(t-butylperoxy)hexine-3,1,1,3,3-tetramethylbutyl hydroperoxide, 2,5-dimethylhexane-2,5-dihydroperoxide, cumene hydroperoxide, 6-butylhydroperoxide, 1,1-bis(t-butylperoxy)-3,3,5-trimethylcyclohexane, 1,1-bis(t-butylperoxy)cyclohexane, t-butylperoxymaleate, t-butylperoxylaurate, t-butylperoxy-3,5,5-trimethyl hexanoate, t-butylperoxy-2-ethylhexyanoate, cyclohexanone peroxide, t-butylperoxyisopropyl carbonate, 2,5-dimethtyl-2,5-di(benzoylperoxy)hexane, 2,2-bis(t-butylperoxy)octane, t-butylperoxyacetate, 2,2-bis(t-butylperoxy)butane, t-butylperoxybenzoate, n-butyl-4,4-bis(t-butylperoxy)valerate, di-t-butyldiperoxysophthalate, methylethyl ketone peroxide, a,a'-bis(t-butylperoxyisopropyl)benzene, dicumyl-oxide, 2,5-dimethyl-2,5-di(t-butylperoxy)hexane, t-butylhydroperoxide, m-toluoyl peroxide, benzoyl proxide, t-butylperoxyisobutylate, octanoylperoxide, decanoylperoxide, lauroylperoxide, stearoylperoxide, propionylperoxide, and succinic acid peroxide and azo compounds such as 1,1'-azobis(cyclohexane-1-carbonitrile and azobisisobutylonitrile, for example. The term "low-temperature active radical polymerization initiator" as used herein refers to an initiator whose decomposition temperature for obtaining 10 hours' half-life is not more than 50° C. and the term "high-temperature active radical polymerization initiator" refers to an initiator whose decomposition temperature for obtaining 10 hours' half-life is on the order of 60° to 220° C.

The amount of the radical polymerization initiator to be added to the monomers cannot be generally defined because it is affected to a great extent by the polymerization degree of the polymer to be obtained and the kinds of the monomers and the radical polymerization initiator. The addition of the radical polymerization initiator in an amount more than is necessary is undesirable because the radical polymerization initiator is not completely used up during the polymerization but is suffered to persist in the produced polymer.

The plasma to be used in the method of plasma-initiated polymerization described above is preferable to be a non-equilibrium plasma, particularly low-temperature plasma due to glow discharge. The low-temperature plasma is obtained by applying a voltage in the range of 20 to 100 W, preferably 30 to 50 W, to a gas held under a vacuum in the range of 0.1 to 10 mmHg. The electrodes usable for the generation of the plasma include external and internal parallel plate electrodes and coil electrodes. Among other electrodes mentioned above, external parallel plate electrodes prove to be particularly desirable. The gases usable as the source for plasma generation include hydrogen, methane, nitrogen, argon, and ethylene. Optionally, the monomer gas itself may be diverted as the gas for the generation of plasma.

In the method of plasma-initiated polymerization, generally during the plasma irradiation, the condensed phase 2 of monomer and the gaseous phase 1 of monomer are not isolated from each other with a partition wall but are retained in an equilibrium state within a container 3 as illustrated in FIGS. 1a and b. The postpolymerization is initiated by irradiating the gaseous phase 1 with the plasma thereby forming polymerization active seeds and causing the polymerization active seeds to contact the surface of the condensed phase. Alternatively, in the method of plasma-initiated polymerization, the condensed phase 2 of monomers and the gaseous phase 1 of monomers may be isolated from each other as with a partition wall 3 as illustrated in FIGS. 2a and b during the course of plasma irradiation and, after the gaseous phase 1 is irradiated with the plasma, the postpolymerization may be initiated by removing the partition wall 3, guiding the gaseous phase 1 containing the polymerization active seeds into the condensed phase 2 thereby establishing contact between the polymerization active seeds and the condensed phase 2. Otherwise, the gaseous phase 1 containing monomer vapors may be kept sealed in the plasma reaction vessel 4 as illustrated in FIGS. 3a to d during the plasma irradiation and, after the plasma irradiation, the postpolymerization may be effected by expelling the gaseous phase 1 out of the reaction vessel 4, introducing a fresh supply of monomers into the reaction vessel 4 which has just served as the site for plasma irradiation, and inducing polymerization of the monomers in the condensed phase 2. These methods are feasible because the plasma reaction vessel 4 made of such a material as glass is lined with a very thin film of the macromolecule and the polymerization active seeds are sequestered in the matric structure of the macromolecule even during the course of the plasma-initiated polymerization and further because a finely divided plasma polymerized macromolecule having similar polymerization active seeds sequestered therein is present in the gaseous phase 2 [Masayuki Kuzutani, "Mechanism of plasma-initiated polymerization," Glossary of Manuscripts for Plasma Chemistry Symposium (Nov. 14, 1984)].

When the plasma-initiated polymerization is carried out by the method illustrated in FIGS. 1a and b or FIGS. 3a to d, the plasma reaction vessel 4 to be used therein is preferable to be made of a material such as to permit ready deposition thereon of the aforementioned very thin film of the polymer. Examples of the material answering this description are various species of glass such as quartz glass and Pyrex glass. Among other species of glass, Pyrex glass proves to be particularly desirable.

In FIG. 1a, FIG. 2a, and FIG. 3a, the reference numeral 5 denotes an electrode, the reference numeral 6 an RF oscillating device, and the reference numeral 7 a control unit. The irradiation of the gaseous phase 2 with the plasma is carried out at a temperature at which the monomer vapor is allowed to exist in the gaseous phase 2 held under a vacuum, generally at a temperature in the neighborhood of room temperature. Though the irradiation time is not specifically defined, a short time generally in the range of several seconds to several minutes suffices for the purpose of generating polymerization active seeds. The postpolymerization in the condensed phase 2 is carried out at a temperature in the neighborhood of room temperature, though more or less variable as with the kind of the radical polymerization initiator to be used. When the postpolymerization is carried out at an excessively high temperature, there arises the possibility that the reaction will proceed in the manner of thermal polymerization and give rise to a polymer of a low polymerization degree. When the postpolymerization is carried out at an unduly low temperature, there ensues the possibility that the reaction will not smoothly proceed. When a low-temperature active radical polymerization initiator is used for initiating the radical polymerization, the postpolymerization in the condensed phase proceeds sufficiently even at a temperature in the range of 0° to −20° C., a low temperature range in which the postpolymerization performed by the conventional plasma-initiated polymerization method proceeds with difficulty.

The adjustment of the polymerization degree of the polymer to be obtained by the method of plasma-initiated polymerization can be effected by causing generation of polymerization active seeds in a theoretical amount where the polymerization active seeds are obtained by plasma irradiation.

The alcohols which are usable for incorporation in the reaction system for the reason described above include alcohols of about 1 to 10 carbon atoms such as methanol, ethanol, n-propanol, isopropanol, n-butanol, sec-butanol, tert-butanol, n-amyl alcohol, isoamyl alcohol, hexanol, heptanol, octanol, capryl alcohol, nonyl alcohol, and decyl alcohol. Among other alcohols mentioned above, lower alcohols, particularly methanol, prove to be desirable. The alcohol thus incorporated may be present in or absent from the gaseous phase during the course of plasma irradiation.

The ultraviolet-absorbing polymer material of this invention which is obtained by the method of polymerization described above possesses substantially the same ultraviolet-absorbing property as a polyalkyl (meth)acrylate possessing as a chain backbone thereof only a (meth)acrylic ester which is one of the two comonomers of the copolymer for the ultraviolet-absorbing polymer material and exhibits high resistance to etching as evinced by the high resistance manifested against an etching liquid containing hydrogen fluoride. Thus, the ultraviolet-absorbing polymer material befits a positive resist material useful for various applications represented by the manufacture of semiconductor devices. Particularly, the copolymer of an extremely high molecular weight which is obtained by the method of plasma-initiated polymerization resorting to the additional use of a radical polymerization initiator mentioned above fits the effort directed to decreasing the wavelength of the light source and increasing the NA as described above and, therefore, can be expected to allow exposure with high resolution.

Ultraviolet-absorbing Polymer Material II

The ultraviolet-absorbing polymer material formed of the copolymer of a (meth)acrylic ester monomer with a monomer possessing at least one substituting fluorine atom as described above excels in resistance to etching and forms a highly suitable positive resist material as described above. When the copolymer is so prepared as to acquire an extremely high molecular weight, it fully meets the purpose of allowing a decrease in the wavelength of the light source and an increase in the NA. When an excimer laser, particularly the KrF laser, is used as the light source, the copolymer under discussion is desired to have a third component incorporated therein by copolymerization.

To be specific, the ultraviolet-absorbing polymer material of this invention in one preferred embodiment comprises a copolymer of a (meth)acrylic ester monomer with a monomer possessing at least one substituting fluorine atom, and a vinyl monomer possessing an aromatic ring or a heterocyclic aromatic ring in the molecular backbone thereof.

The copolymer of a (meth)acrylic ester monomer with a monomer possessing at least one substituting fluorine atom obtained as described above exhibits substantially the same ultraviolet-absorbing property as a polyalkyl(meth)acrylate possessing as the chain backbone thereof only a (meth)acrylic ester which is one of the comonomers of the copolymer and possesses an absorption region on a shorter wavelength side than the wavelength (249 nm) of the KrF laser and, therefore, shows poor absorption to the KrF laser and inferior effect of exposure to the KrF laser. The copolymer of the present embodiment possesses an enhanced absorption property in the neighborhood of 249 nm because this copolymer has incorporated therein by copolymerization a vinyl monomer which possesses a chromophore (aromatic ring or heterocyclic aromatic ring) exhibiting an absorption peak different from that of the (meth)acrylic ester within the ultraviolet wavelength region. Since this photosensitizing activity is produced by the monomer incorporated by copolymerization in the copolymer, it is unusually stable. Moreover, the present copolymer enjoys the high resolution and the high resistance to etching which are owned inherently by the copolymer of a (meth)acrylic ester monomer with a monomer possessing at least one substituting fluorine atom.

The term "aromatic ring" as used in the present specification refers to a ring of six carbon atoms (benzene ring) found in aromatic compounds and a ring of carbon condensate possessing the benzene ring. The term "heterocyclic aromatic ring" as used herein refers to a hetero six-member ring found in aromatic heterocyclic compounds and a ring of benzene condensate.

The vinyl monomers possessing an aromatic ring or a heterocyclic aromatic ring in the molecular skeleton and befitting use as a third component for the copolymer generally include compounds possessing chromophores containing various aromatic rings or heterocyclic aromatic rings such as, for example, carbon benzo condensate rings represented by naphthalene ring, anthracene ring, fluorene ring, phenanthrene ring, triphenylene ring, chrysene ring, and pyrene ring, hetero six-member rings represented by pyridine ring, benzene ring aggregates represented by biphenyl and terphenyl, and heretobenzo condensate rings represented by acetophenone ring, acridine ring, phenazine ring, and carbazole ring. For the ultraviolet-absorbing polymer material to tolerate use of the KrF laser, the adsorption peak of the chromophore is preferable to be as close to 249 nm as possible and to be as large as possible. As typical examples of the vinyl monomer possessing an aromatic ring or a heterocyclic aromatic ring in the molecular skeleton thereof, there may be cited such compounds as vinyl naphthalene, vinyl anthracene, vinyl biphenyl, vinyl fluorene, vinyl pyridine, and N-vinyl carbazole. These are preferred but not exclusive examples. The vinyl monomer possessing an aromatic ring or a heterocyclic aromatic ring in the molecular skeleton and befitting use as the third component for the copolymer need not be limited to a simple monomer but may be a combination of two or more monomers.

The (meth)acrylic ester monomer and the monomer possessing at least one substituting fluorine atom are the same as those already described.

The typical copolymer in the present embodiment of the invention is such that the main chain thereof is substantially composed of the following repeating units:

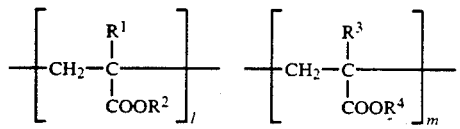

-continued

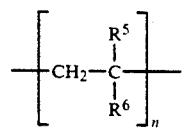

wherein $R^1$, $R^3$, and $R^5$ are independently hydrogen atom or methyl group, $R^2$ is an alkyl group of 1 to 5 carbon atoms, $R^4$ is an alkyl fluoride group of 1 to 8 carbon atoms having at least one hydrogen atom substituted with a fluorine atom, $R^6$ is a group possessing an aromatic ring or a heterocyclic aromatic ring, and $l/m$ is in the range of 0.3 to 5 and $(l+m)/n$ is in the range of 30 to 200).

In the repeating unit mentioned above, the range of 0.3 to 5 is specified for the ratio $l/m$ (molar ratio) for the same reason as given above. Further, in the repeating unit, the reason for fixing the range of 30 to 200 for the ratio $(l+m)/n$ (molar ratio) is that the possibility of the polymerization reaction failing to occur and the possibility of the laser beam projected on the resin film made of the ultraviolet-absorbing polymer material failing to reach easily the interior of the resist film exist when the value of $(l+m)/n$ is less than 30 and the possibility of the laser beam projected on the resist film of the ultraviolet-absorbing polymer material and consequently absorbed in the resist film failing to induce quick decomposition of the resist film is high when the value of $(l+m)/n$ exceeds 200.

The copolymer in the present embodiment is preferable to possess an average molecular weight in the range of $5 \times 10^5$ to $5 \times 10^7$, preferably $5 \times 10^6$ to $5 \times 10^7$, for the same reason as given above.

Various methods of polymerization are conceivable for the production of the copolymer aimed at by this invention by the polymerization of a (meth)acrylic ester monomer, a monomer possessing at least one substituting fluorine atom, and a vinyl monomer possessing an aromatic ring or a heterocyclic aromatic ring in the molecular skeleton. The three comonomers may be subjected simultaneously to the copolymerization. Otherwise, any two of the three comonomers may be subjected to copolymerization and the remaining comonomer subjected to copolymerization with the resultant copolymer. The method causing the three comonomers to be simultaneously subjected to copolymerization is preferred over the other method. Even when the copolymer is desired to be obtained with an extremely high average molecular weight falling in the range of $5 \times 10^6$ to $5 \times 10^7$, it can be prepared easily in a high yield by the method of plasma-initiated polymerization involving additional use of a radical polymerization initiator as described above.

The copolymer of the present embodiment which is obtained by the method of polymerization described above exhibits high resistance to etching as evinced by the high resistance to an etching liquid containing hydrogen fluoride. Since the vinyl monomer possessing an aromic ring or a heterocyclic aromatic ring in the molecular backbone and used as the third component for the copolymer contributes to the copolymer the activity of the chromophore of the aromatic group or the heterocyclic aromatic group in the polymer backbone, the copolymer acquires a higher ultraviolet-absorbing property and exhibits a better absorption property to the excimer laser, particularly the KrF laser, than a polyalkyl (meth)acrylate possessing a (meth)acrylic ester alone as a chain backbone thereof. Thus, the ultraviolet-absorbing polymer material formed of this copolymer can be expected to manifest highly satisfactory resolution in the photoetching using the excimer laser. When the copolymer is prepared with an extremely high molecular weight by the method of plasma-initiated polymerization involving additional use of a radical polymerization initiator, the ultraviolet-absorbing polymer material formed of the copolymer can be expected to be far more effective.

Photoetching Method

The photoetching method of the present invention is characterized by forming a resist film on a substrate, exposing the resist film through a light mask to a light beam of a first wavelength, then giving to the resist a developing treatment, subsequently exposing the developed resist film in an atmosphere of a photodissociating gas to a light beam of a second wavelength, and effecting an etching treatment by virtue of the reactive radical formed in consequence of the dissociation.

In the photoetching method of the present invention, the irradiation with the light beam efficiently and quickly causes a decomposition reaction or a molecular weight-decreasing reaction (positive type) or a hardening reaction (negative type) in the exposed part of the resist film and gives birth to a pattern of high resolution in the resist film. The subsequent etching treatment effects dry etching of the resist film by causing formation of a richly reactive radical of directional quality in high density with satisfactory efficiency owing to the light beam possessing directionality, allowing the chemically active radical to react upon the substrate thereby giving rise to a compound of high vapor pressure, and gasifying this compound. Since this etching reaction is enabled to proceed rapidly and readily with a certain degree of anisotropy, the etching can be accomplished with high resolution faithfully to the contour of the resist pattern mentioned above.

When the light beam is used as the source of irradiation and, at the same time, the etching is carried out by virtue of the reactive radical excited by the light beam as described above, the etching exclusively of the desired part of the resist film can be attained infallibly after the exposure to the light beam of the first wavelength without having the resist film to be subjected preparatorily to a developing treatment. Thus the etching without development can be attained.

Another photoetching method of this invention, therefore, is characterized by forming a resist film on a substrate, exposing the resist film through a light mask to a light beam of a first wavelength, then exposing the resist mask to a light beam of a second wavelength in an atmosphere of a photodissociating gas, and effecting an etching treatment without development by virtue of the reactive radical formed in consequence of dissociation.

The light beam of the first wavelength and the light beam of the second wavelength to be used used in the present invention, to ensure formation of a pattern of high resolution, are preferable to possess wavelngths not exceeding 400 nm. Thus, excimer laser beams and X-ray beams are utilized in this invention, for example. The light beams for use in this invention need not be limited to these beams. As the light beam of the second wavelength, for example, it is permissible to use a light such as microwave radiation which has a long wavelength on the condition that the beam should be capable of exciting a photodissociating gas to be used herein. The excimer laser beams include KrF (249 nm), ArF (193 nm), $F_2$ (157 nm), KrCl (222 nm), ArCl (175 nm), XeBr (282 nm), XeF (350 nm), and XeCl (310 nm), for example.

In the photoetching method of this invention, the light beam of the first wavelength is such as to cause decomposition, decrease of molecular weight (positive type), or hardening (negative type) on the polymer resist film which has been exposed to the light beam. The light beam of the second wavelength is such as to have an effect only in generating the reactive radical capable of etching the substrate and refrain from directly acting on the substrate. For the purpose of enabling the substrate to be etched faithfully to the pattern formed on the resist film in consequence of the exposure to the light beam of the first wavelength, the light beam of the second wavelength is preferable to have a larger wavelength than the light beam of the first wavelength and, therefore, manifest virtually no ability to cause decomposition or decrease in molecular weight in the resist material.

From this point of view, the light beam of the first wavelength is preferable to have a wavelength of not more than 300 nm and the light beam of the second wavelength a wavelength of not less than 300 nm. Particularly, the combination of the KrF laser or the ArF laser as the light beam of the first wavelength with the XeF laser as the light beam of the second wavelength may be cited as a preferred embodiment.

The photodessociating gases which are usable in the photoetching method of this invention for the formation of a reactive radical through dissociation due to the exposure to the light beam of the second wavelength include $NF_3$, $CF_4$, $CClF_3$, $CCl_2F_2$, $C_2H_5Cl_2$, $C_4F_5$ and $C_2Cl_2F_4$ as well as interhalogen compound gases such as $ClF_3$, $Cl_2F_2$, $Cl_3F$, $BrF_3$, $Br_2F_2$, $Br_3F$, $IF_3$, $I_2F_2$, and $I_3F$. Among other photodissociating gases mentioned above, the interhalogen compound gases and $NF_3$, especially $ClF_3$, prove to be particularly preferable. The $ClF_3$ gas, for example, generates radical Cl and F when it is exposed to the light beam. Optionally, this photodissociating gas may be used as mixed with a gas inert to the resist material and the substrate.

The substrate which is subjected to the etching treatment in the photoetching method of the present invention is desired to be capable of inducing a chemical reaction with the aforementioned reactive radical and consequently forming a compound of high vapor pressure. The substances which are usable for the substrate include quartz glass, sapphire, and metal oxides such as silicones, $SiO_2$, $Al_2O_3$, $IrO_x$, and $PdO_x$, for example.

As the material, any of various positive type and negative type resist materials heretofore known to the art can be used. The resist materials which are usable herein include positive type resists such as polymethyl methacrylate, polymethyl isopropenyl ketone, methyl methacrylate-acrylonitrile copolymer, polybutene-1-sulfone, poly-2-methyl-1-pentenesulfone+novolak resin, poly-α-cyanoacrylate, polyhexafluorobutyl methacrylate, hexafluorobutyl methacrylate-glycidyl methacrylate copolymer, methyl methacrylate-tetramethyl tin copolymer, polydimethyltetrafluoropropyl methacrylate, polytrichloroethyl methacrylate, polytrifluoroethyl-α-chloroacrylate, polymethacrylonitrile, thermally crosslinked methacrylic ester copolymers, phenyl methacrylate-methacrylic acid copolymer, and polybutyl methacrylate negative type resists such as glycidyl methacrylate-ethyl acrylate copolymer, polyglycidyl methacrylate, polymethacrylic esters having monomethyl maleate introduced in the side chain thereof, glycidyl methacrylate-chlorostyrene copolymer, allyl methacrylate-methacrylic acid-2-hydroxyethyl copolymer, glycidyl methacrylate-ethyl acrylate copolymer, poly-2,3-dichloro-1-propylacrylate, glycidyl methacrylate-ethyl acrylate copolymer+poly-2,3-dichloro-1-propyl acrylate, poly-2,3-dichloro-1-propyl acrylate+N-vinylcarbazole, and poly-2,3-dichloro-1-propyl acrylate+bisacryloxybutyl tetramethyl disiloxane, for example.

Olefin-sulfone type polymer compounds such as polystyrenesulfone may be cited as other positive type resist materials. Olefin type polymer compounds such as chloromethylated polystyrene, epoxy type polymer compounds such as epoxidized polybutadiene, silicone type polymer compounds such as polyvinyl siloxane, and unsaturated type polymer compounds such as polybutadiene and polydiallyl-o-phthalate may be cited as other negative resist materials.

By reason of the ability to coat the substrate, the positive type resist material is desired to possess an average molecular weight in the range of $10^5$ to $10^7$. The resist film formed of the positive type resist material described above is desired to have a thickness in the range of 100 Å to 10 µm. The reason for fixing this range for the film thickness is that the light beam does not easily reach the bottom of the resist film formulated to allow a decrease in wavelength and an increase in NA when the film thickness exceeds 10 µm and the film formed of the resist material tends to sustain defects such as pinholes and fails to acquire uniform strength when the film thickness is less than 100 Å.

The resist material to be used in the photoetching method of the present invention is desired to exhibit satisfactory absorbing property to the light beam of the first wavelength and satisfactory permeability to the light beam of the second wavelength and, at the same time, possess chemical stability to resist the reactive radical which is generated during the etching treatment. It is preferable to be made of a poly(meth)acrylic ester type polymer which possesses a limiting viscosity number, $\eta$ (as measured in benzene at 30° C.), exceeding $1 \times 10^2$, preferably falling in the range of $2 \times 10^2$ to $4 \times 10^3$, though variable with the kind of the light beam and the kind of the reactive radical to be used. Preferably, the resist material is made of a copolymer of a methacrylic ester with other vinyl monomer differing from the methacrylic ester and possessing a chromophore exhibiting an absorption peak within the range of ultraviolet wavelength as disclosed in PCT/JP87/00954.

Figure 4B:
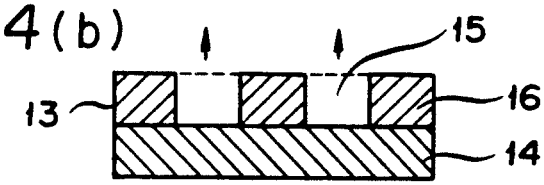
Figure 4C:
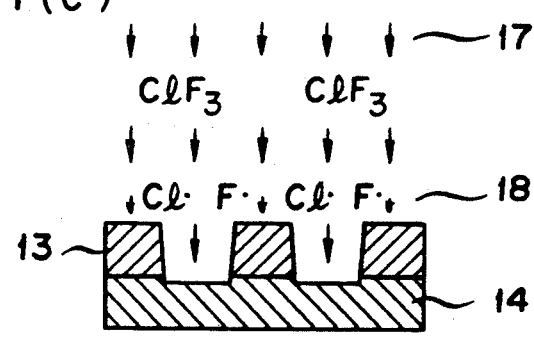

Now the photoetching method of the present invention will be briefly described with reference to drawings. First, as illustrated in FIG. 4a, a resist film 13 is formed by a suitable method such spin coating on a substrate 14, a mask such as a reticle 12 is set in place on the resist film 13, and the resist film 13 is exposed through the reticle 12 to a light beam 11 of the first wavelength. The exposure causes a decomposition reaction, a molecular weight-decreasing reaction (positive type), or a hardening reaction (negative type) in the part of the resist film 13 which has escaped being shielded with a light-impervious part 21 from the light beam 11. FIG. 4 depicts a case using a positive type resist material. Then, the resist film 13 is divested of the reticle 12 and developed with a suitable solvent to effect selective removal of a reaction product 15 formed in the exposed part and consequent formation of a desired resist pattern in an unaltered part 6 of the resist film on the substrate 13 (selective removal of an unhardened part formed in the unexposed part and consequent formation of a desired resist pattern in the hardened part exposed to the light beam when the negative resist material is used). Subsequently, as illustrated in FIG. 4c, the substrate 13 is placed in an atmosphere of a photodissociating gas such as ClF3 gas and exposed to the light beam 17 of the second wavelength from a light source disposed above. The light beam 17 of the second wavelength efficiently acts on the photodissociating gas to promote the dissociation of the photodissociating gas and induce formation of a reactive radical (F radical and Cl radical). Since the part of the substrate 14 not covered with the resist film 13 is allowed to contact the reactive radical of high density generated as described above (the part of the substrate 14 covered with the resist film 3 remains shielded with the resist film 3 and is not allowed to contact the reactive radical), a chemical reaction proceeds suddenly between the compound forming the substrate 14 and the reactive radical in the part of the substrate 14 not covered with the resist film 3. Since the reaction product of high vapor pressure which is formed by the chemical reaction is left diffusing in the ambient air, the substrate 14 acquires an inscribed pattern. Thus, dry etching is completed.

EXAMPLES

Now, the present invention will be described more specifically below with reference to working examples, which are intended to be merely illustrative of and not in any sense limitative of the invention.

Example 1

A polymerization tube of Pyrex glass having an inside diameter of 15 mm and an inner volume of 41 ml was charged with 5.34 ml ($5.00 \times 10^{-2}$ mol) of methyl methacrylate (MMA), 11.86 g ($5.00 \times 10^{-2}$ mol) of hexafluoroisopropyl methacrylate (HFIPMA), and 0.017 g ($4.13 \times 10^{-3}$ mol/liter) of benzoyl peroxide, connected to a vacuum line, and frozen with liquefied nitrogen. This system was deaerated under $10^{-3}$ Torr for thorough removal of oxygen and again fused. This procedure was repeated two more times. The polymerization tube was sealed by closing its cock and the monomers held therein were thoroughly cooled with liquefied nitrogen to be frozen. When part of the monomer mixture in the polymerization tube began to melt near room temperature, plasma was generated in the gaseous phase. Two plate electrodes of copper $15.0 \times 10.0$ cm$^2$ in surface area were parallelly opposed to each other across an intervening space of 18 mm. To the electrodes, an output of 50 W emitted from a 13.56-MHz radio wave (RF) oscillator fitted with a control unit was applied to the electrodes. The plasma irradiation time was 60 seconds. After the plasma irradiation, the polymerization tube was sealed and left standing at 25° C. for five days for the system to undergo postpolymerization. The polymerization product thus obtained was refined by being dissolved in 100 ml of tetrahydrofuran, reprecipitated with 2.0 liters of methanol, and subjected to filtration, to produce a white polymer. The polymer weighed 2.34 g, representing an yield of 13.9% by weight. This polymer showed a melting point of 263.0° to 276.5° C. and a limiting viscosity number, $\eta$, of $6.36 \times 10^2$ as measured in acetone at 25° C. The average molecular weight of this polymer determined from the limiting viscosity number in accordance with the Mark-Houwink equation, $\eta = KM^{\alpha}$, using the coefficients, $K = 7.5 \times 10^{-3}$, and $\alpha = 0.70$, concerning polymethyl methacrylate, was about $8.8 \times 10^6$.

Then, the copolymer obtained as described above was dissolved in a concentration of 1% by weight in methyl isobutyl ketone. The resultant solution was applied with a spin coater (produced by Mikawa K.K. and marketed under product code of "IH-D2") to a silicon wafer to form a thin film 300 nm in thickness. The resultant coated silicon wafer was baked at 170° C. for 30 minutes and tested for resistance to edging with hydrofluoric acid.

The test for the resistance to edging was carried out by placing a drop of an aqueous 50% hydrofluoric acid solution with a cotton bud and allowing this drop to stand on the wafer at 25° C. for five minutes.

Figure 5:
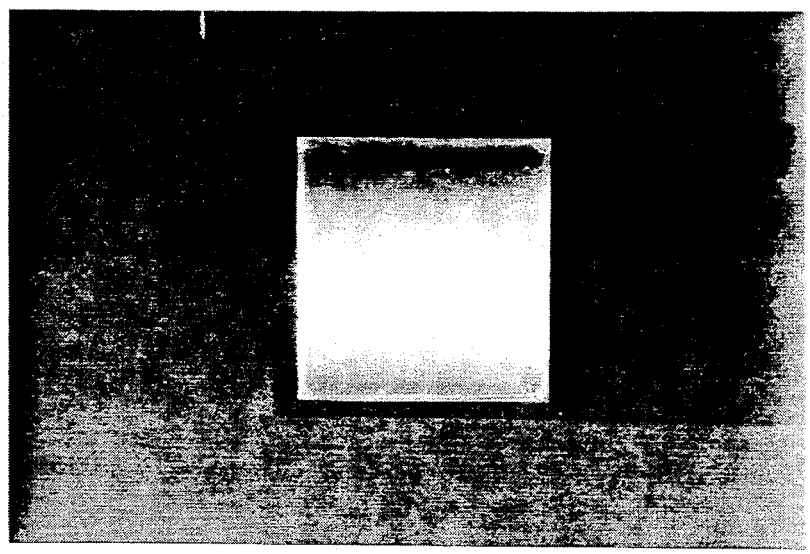
FIGS. 5 to 7 are photographs of the surfaces of resist films representing the results of a etching resistance test performed in Examples 1 and Controls 1 and 2.

At the end of the standing, the water was washed with water and the surface of the wafer was visually examined. As shown in FIG. 5, no sign of degeneration or corrosion was detected.

When the copolymer was examined with an ultraviolet absorption spectrometer, it was found to manifest a substantially equal absorption property as that of the ultraviolet-absorbing polymer material of Control 1 to be described hereinafter. The transmittance of this copolymer at 193 nm was somewhere between about 20 to 30%, whereas that of the PMMA was virtually 0%.

CONTROL 1

Figure 6:
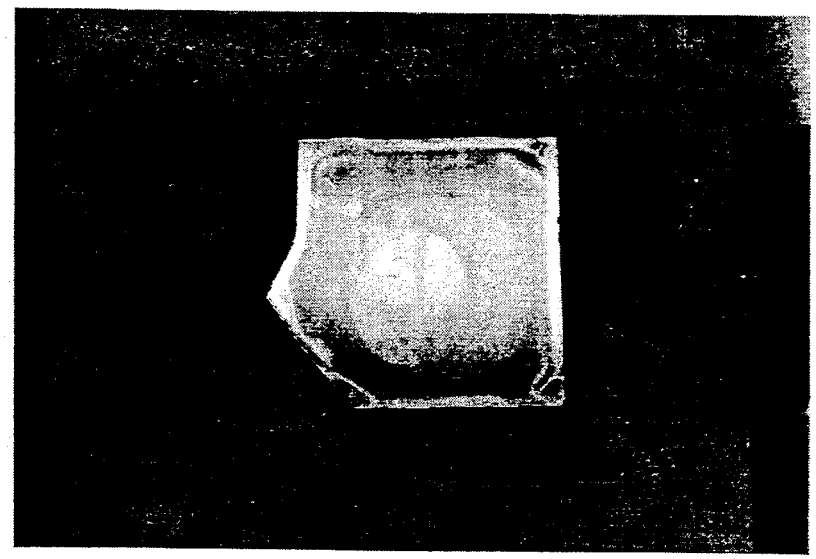

A super-polymer (Mv: viscosity average molecular weight $2.7 \times 10^7$) polymethyl methacrylate was synthesized in the place of the copolymer (MMA-HFIPMA) of Example 1 and was tested for resistance to etching by following the procedure of Example 1. It was found to be corroded by an aqueous hydrofluoric acid solution as illustrated in FIG. 6.

CONTROL 2

Figure 7:
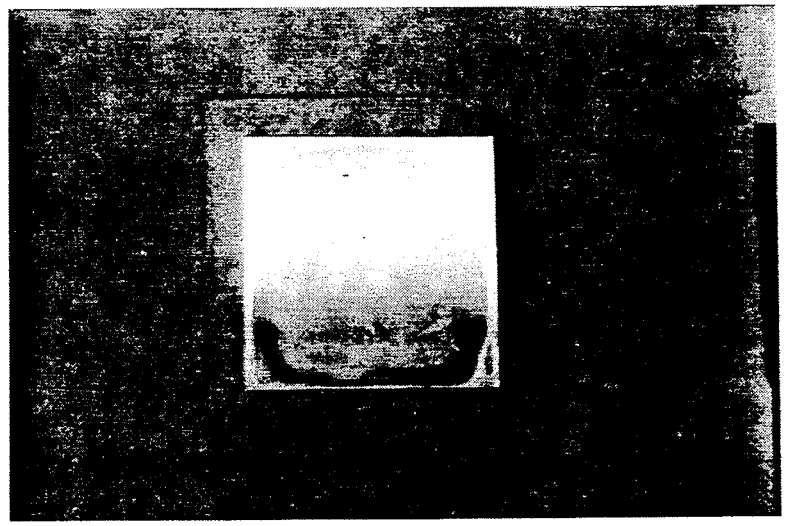
Figure 8:
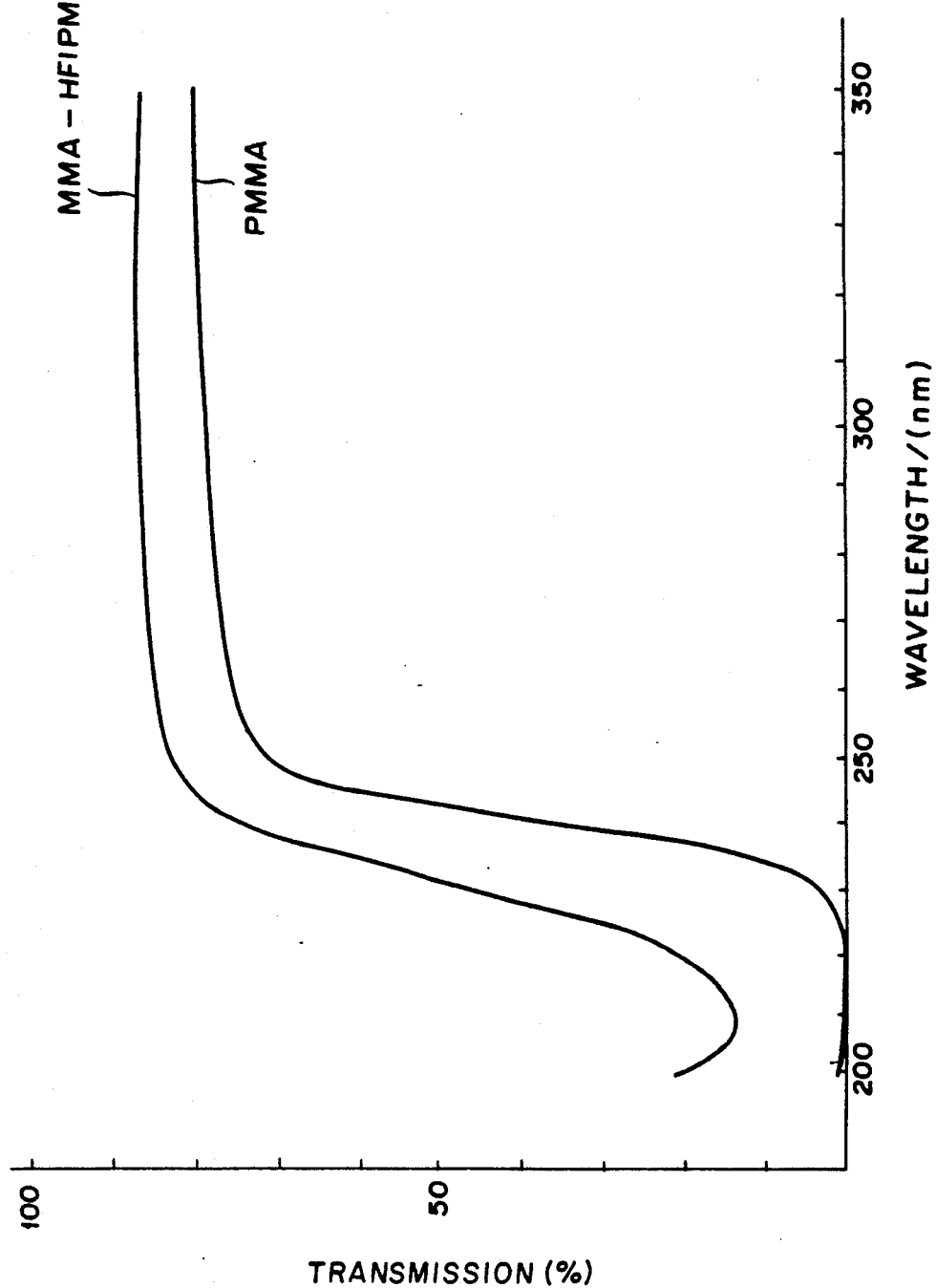
FIG. 8 is a diagram of ultraviolet absorption spectrum charts of a copolymer obtained in Example 1 of this invention and a PMMA obtained in Control 1.

A super-polymer compound (Mv: viscosity-average molecular weight $2.5 \times 10^7$) was synthesized in the place of the copolymer (MMA-HFIDMA) of Example 1 by polymerizing 60 mols of MMA with 1 mol of 2-vinyl naphthalene. When this compound was tested for resistance to etching, it was found to be corroded by an aqueous hydrofluoric acid solution as illustrated in FIG. 7.

Example 3

A polymerization tube of Pyrex glass having an inside diameter of 15 mm and an inner volume of 42 ml was charged with 2.67 ml ($2.50 \times 10^{-2}$ mol) of methyl methacrylate (MMA), 4.54 ml ($2.50 \times 10^{-2}$ mol) of hexafluoroisopropyl methacrylate (HFIPMA), 0.096 g ($6.25 \times 10^{-4}$ mol) of 2-vinyl naphthalene and 0.005 g ($4.13 \times 10^{-3}$ mol/liter) of benzoyl peroxide (BPO), connected to a vacuum line, and frozen with liquefied nitrogen. This system was deaerated under $10^{-3}$ Torr for thorough removal of oxygen and then fused again. This procedure was repeated three times. Then, the polymerization tube was sealed by closing its cock and the monomers held therein were thoroughly cooled and frozen with liquefied nitrogen. When part of the monomer mixture in the polymerization tube began to melt near room temperature, plasma was generated in the gaseous phase. Two plate electrodes of copper $15.0 \times 10.0$ cm, in surface area were opposed parallelly to each other across an intervening space of 18 mm. An output of 50 W emitted from a 13.56-Mhz radio wave (RF) oscillator fitted with a control unit was applied to the electrodes. The plasma irradiation time was 60 seconds. After completion of the plasma irradiation, the polymerization tube was sealed and left standing at 25° C. for 10 days to cause postpolymerization of the monomer mixture. The resultant polymerization product was refined by being dissolved in 100 ml of acetone, reprecipitated with 2.0 liters of methanol, and subjected to filtration, to obtain a white polymer. The polymer thus obtained weighed 0.70 g, representing an yield of 8.2% by weight. The melting temperature of this polymer was 263.0° to 276.5° C. The limiting viscosity number, $\eta$, of this polymer in acetone at 25° C. was $3.70 \times 10^2$. The average molecular weight of this polymer determined from the lilting viscosity number $\eta$ in accordance with the Mark-Houwink equation, $\eta = KM^{\alpha}$, using the coefficients, $K = 7.5 \times 10^{-3}$ and $\alpha = 0.70$, concerning polymethyl methacrylate, was about $5.12 \times 10^6$.

Then, the copolymer was dissolved in a concentration of 1% by weight in methyl isobutyl ketone. The resultant solution was applied with a spin coater (produced by Mikasa K.K. and marketed under product code of "IH-D2") to a silicon wafer to form a thin film of the solution 300 nm in thickness. The coated silicon wafer was baked at 170° C. for 30 minutes and then tested for resistance to etching with hydrofluoric acid.

This test for the resistance to etching was carried out by placing a drop of an aqueous 50% hydrofluoric acid solution with a cotton bud on the coated wafer and allowing the drop to stand thereon at 25° C. for 5 minutes.

Figure 9:
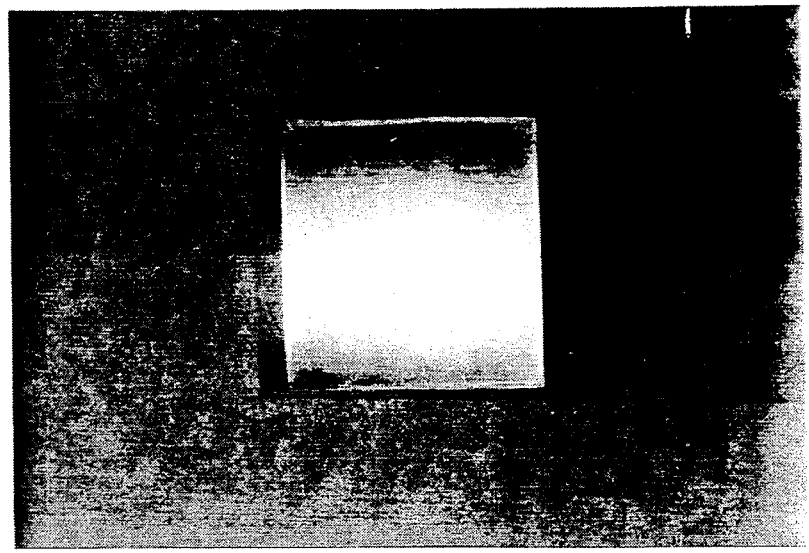
FIGS. 9 and 10 are photographs of the surfaces of resist films representing the results of a etching resistance test performed in Example 3 and Example 4.

The coated wafer was washed with water and the surface thereof was examined by visual observation. As illustrated in FIG. 9, no sign of degeneration or corrosion was detected.

Figure 11:
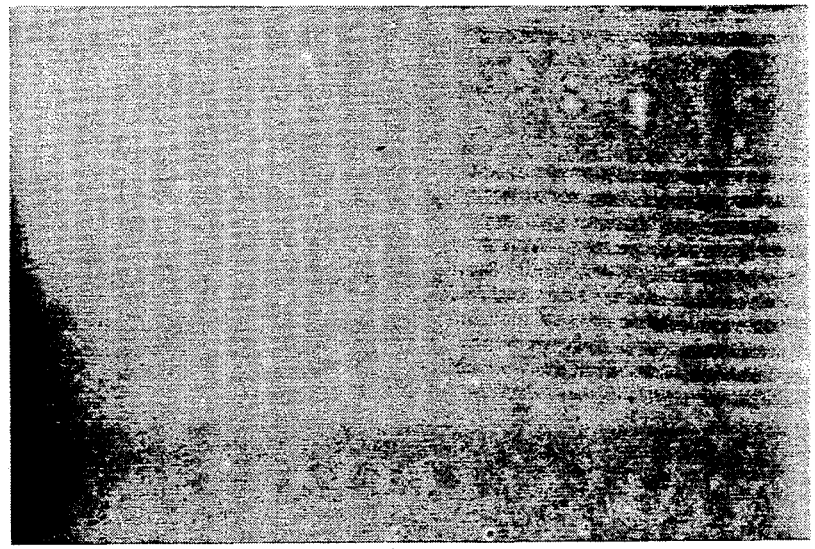
FIG. 11 is an electron micrograph of a lithography pattern obtained in Example 3.

A solution of 1% by weight of the copolymer in methylisobutyl ketone was applied with the spin coater on a silicon wafer in the same manner as described above, to form a resist film about 3,000 Å in thickness thereon. The film as deposited fast on the substrate was prebaked at 110° C. for 30 minutes and irradiated five times (1 pulse: about 10 nanoseconds) with a KrF (249 nm) laser [an interfering KrF laser beam (100 mJ/cm$^2$) with the diverging angle of beam fixed at 0.4 Mrad] generated by the use of a laser generator (produced by Tachst Laser Systems Inc. and marketed under product code of "SO1XR") and passed through a slit (1.0 mm in width). Subsequently, the film and the substrate were subjected to afterbaking at 170° C. for 30 minutes and developed with a Freon substrate grade developer (a 90% propanol-containing developer: produced by Daikin K. K. and marketed under trademark designation of "Daiflon FBM110") at 25° C. for five minutes. The lithographic pattern consequently obtained was a clear portrait composed of lines and intervening spaces, both 1.0 μm in width, as illustrated in FIG. 11. This fact clearly indicates that the copolymer was capable of portraying a clear and fine pattern with the KrF laser as the source of irradiation.

An ultraviolet absorption spectrum obtained of this copolymer showed a substantially similar absorption property as that of the PMMA-2-vinyl naphthalene copolymer of Control 3 to be described hereinafter as illustrated in FIG. 12. Incidentally, the copolymer showed a transmittance of about 2.0% at 249 nm, indicating that this copolymer possessed a high absorption property to the KrF laser.

Example 4

A plasma-initiated polymerization reaction was carried out by following the procedure of Example 3, except that the polymerization tube was charged with 2.67 ml ($2.50 \times 10^{-2}$ mol) of methyl methacrylate, 4.54 ml ($2.50 \times 10^{-2}$ mol) of hexafluoroisopropyl methacrylate, 0.129 g ($8.33 \times 10^{-4}$ mol) of 2-vinyl naphthalene, and 0.005 g ($4.13 \times 10^{-3}$ mol/liter) of a polymerization initiator (BPO) instead. As the result, there was obtained a white powdery polymer weighing 0.70 g, representing a yield of 6.41% by weight. The limiting viscosity number, $\eta$, of this polymer as measured in acetone at 25° C. was $3.41 \times 10^2$. The average molecular weight of this polymer determined from the limiting viscosity number $\eta$ in accordance with the Mark-Houwink equation, $\eta = KM^\alpha$, using the coefficients, $K = 7.5 \times 10^{-3}$ and $\alpha = 0.70$, concerning polymethyl methacrylate, was about $4.51 \times 10^6$.

Figure 10:
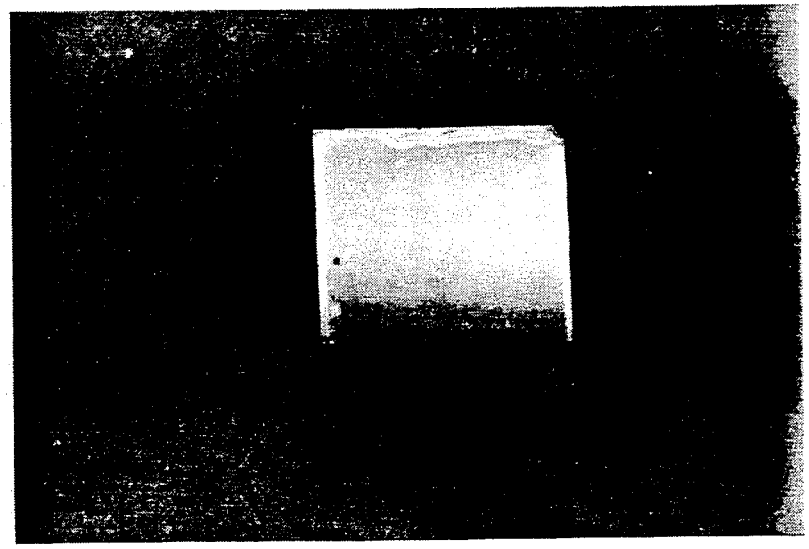

Then, the copolymer obtained as described above was tested for resistance to each etching with hydrofluoric acid in the same manner as in Example 3. As illustrated in FIG. 10, no sign of degeneration or corrosion was detected.

An ultraviolet absorption spectrum of this copolymer is shown in FIG. 12.

Example 5

A plasma-initiated polymerization reaction was carried out by following the procedure of Example 3, except that the polymerization tube was charged with 2.67 ml ($2.50 \times 10^{-2}$ mol) of methyl methacrylate, 3.56 ml ($2.50 \times 10^{-2}$ mol) of trifluoroethyl methacrylate, 0.129 g ($8.33 \times 10^{-4}$ mol) of 2-vinyl naphthalene, and 0.005 g ($4.13 \times 10^{-3}$ mol/liter) of a polymerization initiator (BPO) instead. The viscosity average molecular weight of the resultant polymer was about $4.57 \times 10^5$.

Then, the copolymer thus obtained was tested for resistance to etching with hydrofluoric acid in the same manner as in Example 3. Similarly to the test in Example 3, no sign of degeneration or corrosion was detected.

An ultraviolet absorption sepctrum of this copolymer is shown in FIG. 12.

Control 3

A plasma-initiated polymerization reaction was carried out by following the procedure of Example 3, except that the polymerization tube was charged with 2.67 ml ($250 \times 10^{-2}$ mol) of methyl methacrylate, 0.064 g ($4.17 \times 10^{-4}$ mol) of 2-vinyl naphthalene, and 0.005 g ($4.13 \times 10^{-3}$ mol/liter) of a polymerization initiator (BPO) instead. As the result, there was obtained a white powdery polymer weighing 0.18 g, representing a yield of 75% by weight. The limiting viscosity number, $\eta$, of this polymer as measured in benzene at 30° C. was $5.99 \times 10^2$. The average molecular weight of this polymer determined from the limiting viscosity number $\eta$ in accordance with the Mark-Houwink equation, $\eta = KM^\alpha$, using the coefficients, $K = 5.2 \times 10^6$ and $\alpha = 0.76$, concerning polymethyl methacrylate, was about $4.57 \times 10^6$.

Then, the polymer thus obtained was tested for resistance to etching with hydrofluoric acid in the same manner as in Example 3. Similarly to the test in Control 2, the resist film was found to sustain injury.

Example 6

(1) A polymerization tube of Pyrex glass having an inside diameter of 15 mm and an inner volume of 42 ml was charged with 5.34 ml ($5.00 \times 10^{-2}$ mol) of methyl methacrylate, 0.90 g ($5.00 \times 10^{-3}$ mol) of 4-vinyl biphenyl, and 0.005 g ($4.13 \times 10^{-3}$ mol/liter) of benzoyl peroxide (BPO), connected to a vacuum line, and frozen with liquefied nitrogen.

(2) This system was deaerated under $10^{-3}$ Torr for thorough removal of oxygen and then fused again. This procedure was repeated two times. Then, the polymerization tube was sealed byclosing its cock and the monomers held therein were thoroughly cooled and frozen with liquefied nitrogen. When part of the monomer mixture in the polymerization tube began to melt near room temperature, plasma was generated in the gaseous phase. Two plate electrodes of copper $15.0 \times 10.0$ cm² in surface area were parallelly opposed to each other across an intervening space of 18 mm. An output of 50 W emitted from a 13.56-MHz radio wave (RF) oscillator fitted with a control unit was applied to the electrodes. The plasma irradiation time was 60 seconds.

(3) After completion of the plasma irradiation, the polymerization tube was sealed and left standing at 25° C. for five days to cause postpolymerization. The resultant product of polymerization was refined by being dissolved in 100 ml of tetrahydrofuran, reprecipitated with 2.0 liters of methanol, and subjected to filtration, to obtain a white resist material. The polymer thus obtained weighed 0.88 g, representing a yield of 15.8% by weight. The limiting viscosity number, $\eta$, of this polymer as measured in acetone at 30° C. was $1.65 \times 10^2$. The average molecular weight of this polymer determined from the limiting viscosity number in accordance with the Mark-Houwink equation, $\eta = KM^\alpha$, using the coefficients, $K = 5.2 \times 10^{-3}$ and $\alpha = 0.76$, concerning polymethyl methacrylate, was about $8.38 \times 10^5$.

(4) The resist material thus obtained was dissolved in a concentration of 1% by weight in methylisobutyl ketone. The resultant solution was cast with a spin coater (produced by Midasa K.K. and marketed under product code of "IH-D2") on a quartz plate to form a film 3,000 Å in thickness thereon. The film was subjected to baking at 110° C. for 30 minutes.

(5) Subsequently, the film was exposed in the open air through a reticle (minimum line width 0.5 mm) to five pulses (one pulse: about 10 nanoseconds) of the KrF laser beam (249 nm, 1,000 mJ/cm²) generated as a light beam of the first wavelength, with the diverging angle of beam fixed at 0.4 Mrad by the use of a variable resonator as an optical system. The laser oscillator used herein was a product of Tachsto Laser Systems Inc. marketed under product code of "SO1XR."

(6) The film was then subjected to a baking treatment at 150° C. for 15 minutes and then developed by 30 seconds' immersion in a developer consisting of a 3:7 mixed liquid (volume ratio) of a tetrachloride and isopropyl alcohol.

(7) Then, the quartz substrate coated with the resist film was placed in an atmosphere of $ClF_3$ (5 mmHg) and exposed to 20 pulses (one pulse about 10 nanoseconds, 50 mJ/cm²) of the XeF laser (359 nm) projected downwardly as a light beam of the second wavelength on the resist film. As the result, a clear pattern composed of lines of the minimum width of 0.5 $\mu$m was etched on the quartz substrate.

Example 7

A resist material was obtained by polymerization by repeating the steps (1) to (3) of Example 6. A resist film was formed on a quartz plate by the treatment of the step (4) of Example 6.

(5) Then, the film was exposed in the open air through a reticle (minimum line width 0.5 mm) to five pulses (one pulse: about 10 nanoseconds) of the KrF laser beam (249 nm, 1,000 mJ/cm$^2$) generated as a light beam of the first wavelength, with the diverging angle of the beam fixed at 0.4 Mrad by the use of a variable resonator as an optical system. The laser generator used herein was identical to that used in Example 1.

(6) Then, the film was subjected to a baking treatment at 150° C. for 15 minutes and not subjected to the subsequent developing treatment with a developer comprising a 3:7 mixed liquid (volume ratio) of methylisobutyl ketone and isopropyl alcohol. The quartz substrate coated with the resist film was placed in an atmosphere of (250 mmHg) and exposed to 20 pulses (one pulse: about 10 nanoseconds, 170 mJ/cm$^2$) of the XeF laser (350 nm) projected as a light beam of the second wavelength downwardly on the resist film. As the result, a clear pattern composed of lines of the minimum width of 0.5 μm was etched on the quartz plate similarly to Example 6.

Resist materials obtained by copolymerization by repeating the steps (1) to (3) of Example 6, except that 2-vinyl pyridine, N-carbazole, and 4-vinyl naphthalene were severally used in the place of 4-vinyl biphenyl, produced the same results as in Example 6 and Example 7.

Example 8

(1) A polymerization tube of Pyrex glass having an inside diameter of 15 mm and an inner volume of 42 ml was charged with 7.37 ml (2.50×10$^{-2}$ mol) of methyl methacrylate, 0.064 g (4.17×10$^{-4}$ mol) of 2-vinyl naphthalene, and 0.005 g (4.13×10$^{-3}$ mol/liter) of benzoyl peroxide (BPO), connected to a vacuum line, and frozen with liquefied nitrogen.

(2) The system was deaerated under 10$^{-3}$ Torr for thorough removal of oxygen and then fused again. This procedure was repeated three times. The polymerization tube was sealed by closing its cock and the monomers held therein were thoroughly cooled and frozen with liquefied nitrogen. When part of the monomer mixture in the polymerization tube was melted near room temperature, plasma was generated in the gaseous phase. Two plate electrodes 15.0×10.0 cm$^2$ in surface area were parallely opposed to each other across an intervening space of 18 mm. An output of 50 W emitted from a 13.56-MHz radio wave (RF) oscillator fitted with a control unit was applied to the electrodes. The plasma irradiation time was 60 seconds.

(3) After completion of the plasma irradiation, the polymerization tube was sealed and left standing at 25° C. for five days to cause postpolymerization. The resultant product of polymerization was refined by being dissolved in 100 ml of tetrahydrofuran, reprecipitated with 2.0 liters of methanol, and subjected to filtration, to produce a white resist material. The polymer thus obtained weighed 2.09 g, representing a yield of 79.7% by weight. The limiting viscosity number, $\eta$, of this polymer measured in acetone at 30° C. was 5.97×10$^2$. The average molecular weight of this polymer determined from the limiting viscosity number $\eta$ in accordance with the Mark-Houwink equation, $\eta = KM^\alpha$, using the coefficients, $K=5.2\times10^{-3}$ and $\alpha=0,76$, concerning polymethyl methacrylate, was about 4.55×10$^6$.

Thereafter, the steps (4) to (7) of Example 6 were repeated. As the result, a clear pattern composed lines of the minimum width of 0.5 μm etchined in the quartz plate similarly to Example 6.

Example 9

A resist material was polymerized by repeating the steps (1) to (3) of Example 8. This resist material was treated by the steps (4) and (5) of Example 8.

(6) Then, the resist film formed on the quartz plate was subjected to a baking treatment at 150° C. for 15 minutes. The quartz substrate coated with the resist film was placed in an atmosphere of ClF$_3$ (250 mmHg) and exposed to 20 pulses (one pulse: about 10 nanoseconds, 170 mJ/cm$^2$) of the XeF laser (350 nm) projected as a light beam of the second wavelength downwardly on the resist film. As result, a clear pattern composed of lines of the minimum width of 0.5 μm was etched in the quartz plate similarly to Example 8.

INDUSTRIAL APPLICABILITY

As described above, this invention is directed to a ultraviolet-absorbing polymer material which comprises a copolymer of a (meth)acrylic ester monomer with a monomer possessing at least one substituting fluorine atom. The ultraviolet-absorbing polymer material, therefore, is capable of manifesting resistance to etching, particularly to etching with an etching liquid containing hydrogen fluoride and, at the same time, enjoying the highly satisfactory properties such as resolutionultraviolet absorption, mechanical strength, and thermal stability which are owned inherently by the poly(meth)acrylic ester. It is, accordingly, useful advantageously in various applications as a positive resist material permitting efficient use of the radiation in the near ultraviolet to ultraviolet region. It will contribute immensely to a wide range of industrial fields represented by the electronic industry specializing in the manufacture of semiconductor devices. Further, when the ultraviolet-absorbing polymer material of this invention is produced with an extremely high average molecular weight as in the range of 5×10$^6$ to 5×10$^7$, the resist film formed of the ultraviolet-absorbing polymer material is allowed is allowed to have a very small thickness and acquire notably improved resolution and enhanced resistance to heat. The ultraviolet-absorbing polymer material, therefore, meets the effort directed to decreasing the wavelength of the light source and increasing the NA and allows inscription of a pattern composed of lines of the minimum width of not more than 1 μm.

When the ultraviolet-absorbing polymer material of this invention comprises a terpolymer of a (meth)acrylic ester monomer with a monomer having at least one substituting fluorine atom and a vinyl monomer possessing an aromatic ring or a heterocyclic aromatic ring in the molecular backbone thereof, it acquires an enhanced ultraviolet absorbing properly and exhibits extremely high absorptance to the radiation of a wavelength in the neighborhood of 249 nm or extremely low transmittance. The resist film formed of this ultraviolet-absorbing polymer material, therefore, can be expected to exhibit highly satisfactory resolution in the etching using the KrF laser, an excimer laser, as the source of irradiation. In the excimer laser exposure method, the resist film can be expected to produce a pattern with high resolution quickly by an easy procedure.

The present invention is further directed to a photoetching method characterized by forming a resist film on a substrate, exposing this film through a light mask to a light beam of a first wavelength, subjecting the resist to a developing treatment, then exposing the resist tin an atmosphere of a photodissociating gas to a light beam of a second wavelength, and effecting an etching treatment by virtue of a reactive radical formed in consequence of the dissociation and to a photoetching method characterized by forming a resist film on a substrate, exposing the film through a light mask to a light beam of a first wavelength, then exposing the film in an atmosphere of a photodissociating gas to a light beam of a second wavelength, and effecting undeveloped etching treatment by virtue of a reactive radical formed in consequence of the dissociation. The exposure of the resist material to radiation, therefore, can be efficiently and quickly effected and the subsequent etching treatment can be performed with a light-excited radical quickly and easily. These methods allow a generous reduction in process (particularly the latter method allows this reduction in process conspicuously because of the omission of the step of development). Further, since the etching of high resolution is attained anisotropicallyj with the radical which is excited by a light beam possessing directionality, the methods of this invention contribute greatly to a wide range of industrial fields represented by the electronic industry specializing in the manufacture of semiconductor devices.

Further, in the photoetching methods of the present invention, when the photodissociating gas is an interhalogen compound gas such as $ClF_3$, the light beam of the first wavelength is KrF laser or ArF laser, and the light beam of the second wavelength is XeF laser, their processes proceed with greater smoothness and bring about more desirable results.

We claim:

1. An ultraviolet-absorbing polymer material which comprises a copolymer of a (meth)acrylic ester monomer with a monomer possessing at least one substituting fluorine atom and a vinyl monomer possessing an aromatic ring or a heterocyclic aromatic ring in the molecular backbone thereof.

2. An ultraviolet-absorbing polymer material according to claim 1, wherein the main chain thereof is composed substantially of the following repeating units:

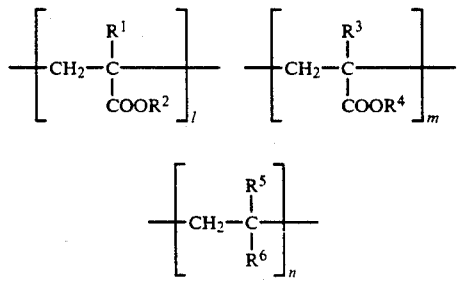

wherein $R^1$, $R^3$, and $R^5$ are independently hydrogen atom or methyl group, $R^2$ is an alkyl group of 1 to 5 carbon atoms, $R^4$ is an alkyl fluoride group of 1 to 8 carbon atoms having at least one hydrogen atom substituted with a fluorine atom, $R^6$ is a group possessing an aromatic ring or a heterocyclic aromatic ring, and $l/m$ is in the range of 0.3 to 5 and the ratio of $(l+m)/n$ is in the range of 30 to 200.

3. An ultraviolet-absorbing polymer material according to claim 1 or claim 2, wherein the average molecular weight is in the range of $5 \times 10^5$ to $5 \times 10^7$.

4. An ultraviolet-absorbing polymer material according to claim 1 or claim 2, wherein the average molecular weight is in the range of $5 \times 10^6$ to $5 \times 10^7$.

* * * * *